United States Patent
Boerstler et al.

(10) Patent No.: US 6,222,402 B1
(45) Date of Patent: Apr. 24, 2001

(54) DIFFERENTIAL CHARGE-PUMP WITH IMPROVED LINEARITY

(75) Inventors: David William Boerstler, Round Rock; Norman Karl James, Austin, both of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/148,219

(22) Filed: Sep. 4, 1998

(51) Int. Cl.[7] ........................................................ H03L 7/06
(52) U.S. Cl. ............................................ 327/157; 327/536
(58) Field of Search .................................... 327/148, 157, 327/536, 537, 306

(56) References Cited

U.S. PATENT DOCUMENTS 5,477,193 * 12/1995 Burchfield ................................ 331/8
5,705,947 * 1/1998 Jeong ..................................... 327/270
5,801,578 * 9/1998 Bereza ................................... 327/536

* cited by examiner

Primary Examiner—Toan Tran
Assistant Examiner—Linh Nguyen
(74) Attorney, Agent, or Firm—Casimer K. Salys; Felsman, Bradley, Vaden, Gunter & Dillon, LLP

(57) ABSTRACT

A charge-pump which substantially reduces transient currents in the switches that connect output control signals to current sources and sinks, to provide improved response for very small phase errors. In a differential embodiment, the charge-pump uses four transistors connected respectively to two current sources and two current sinks, and the reduction in transients is achieved by providing four additional transistors which are connected with the first four transistors to form four pairs of source-coupled transistors. The four pairs of source-coupled transistors are cross-connected to keep the current sources and sinks at constant bias through near-constant conduction, which substantially eliminates any turn-on transients and provides a smoother response.

15 Claims, 5 Drawing Sheets

DIFFERENTIAL CHARGE-PUMP WITH IMPROVED LINEARITY

BACKGROUND OF THE INVENTION

1. Field of the Invention

The present invention generally relates to electronic clock circuits, and more particularly to an electronic clock that is particularly suited for a high-speed microprocessor, which uses a phase-lock loop (PLL) circuit having an improved charge-pump that reduces or eliminates transient currents in complementary metal-oxide semiconducting (CMOS) switching devices, thereby providing a more linear response for small phase errors.

2. Description of Related Art

Electronic circuits that provide clock signals are used in a wide assortment of devices, and particularly in computer systems. Microprocessors and other computer components, such as random access memory (RAM), device controllers and adapters, use clock signals to synchronize various high-speed operations. These computer clock circuits often use a phase-lock loop (PLL) circuit to synchronize (deskew) an internal logic control clock with respect to an external system clock.

A typical prior art PLL circuit 1 is shown in FIG. 1 and includes a phase/frequency detector (PFD) 2, a charge-pump 3, a low-pass filter 4, and a voltage-controlled oscillator (VCO) 5. Phase/frequency detector 2 compares two input signals, a reference signal $f_{ref}$ (from the external system clock) and a feedback signal $f_{fb}$, and generates phase error signals that are a measure of the phase difference between $f_{ref}$ and $f_{fb}$. The phase error signals ("UP" and "DOWN") from detector 2 are used to generate control signals by charge-pump 3 which are filtered by low-pass filter 4 and fed into the control input of voltage-controlled oscillator 5. Voltage-controlled oscillator 5 generates a periodic signal with a frequency which is controlled by the filtered phase error signal.

The output of voltage-controlled oscillator 5 is coupled to the input $f_{fb}$ of phase/frequency detector 2 directly or indirectly through other circuit elements such as dividers 6, buffers (not shown) or clock distribution networks (not shown), thereby forming a feedback loop. If the frequency of the feedback signal is not equal to the frequency of the reference signal, the filtered phase error signal causes the frequency of voltage-controlled oscillator 5 to shift (upwards or downwards) toward the frequency of the reference signal, until voltage-controlled oscillator 5 finally locks onto the frequency of the reference; following frequency acquisition, phase acquisition is achieved in a similar manner. The output of voltage-controlled oscillator 5 is then used as the synchronized signal (for internal logic control). In cases where the incoming data is a self-clocking bit stream, the comparator system is used to extract the clock information from the data stream itself.

One problem with phase/frequency detectors is that jitter is introduced into the loop due to the "dead zone." The phase error signal that controls the VCO has a first polarity in the case where the reference signal has a phase lag, and the other polarity when a phase lead is detected. For very small phase differences (e.g., the zero-phase-error, steady-state condition of the locked PLL), in the transition from one polarity to the other there is often a region referred to as the dead zone where the phase error signal is insensitive to phase-difference changes. However, it is important that the control characteristic of the PLL be linear in a phase-difference interval that contains the zero-phase-error point, in order to avoid the VCO uncontrollably changing its phase. In this dead zone (or dead band) the VCO's eventual output signal is unpredictable and liable to dither.

High-performance, low-jitter PLL's thus require accurate sensing and correction of the phase and frequency error between the reference and feedback clock signals. A plot of this control voltage as a function of phase error should produce a linear response over the cycle and should pass through the origin (dead zone), as shown by the dashed line in FIG. 2. The actual response of conventional devices, however, is discontinuous (bent), primarily as a result of certain transient currents which are highly variable.

These troublesome transient currents can be understood by considering how conventional charge-pumps have current sources and sinks which are gated by complementary metal-oxide semiconducting (CMOS) devices switched by the PFD outputs. The gated devices are in series with the current sources and sinks (which may or may not be programmable for controlling the magnitude of the current). The gated devices may be at the top and bottom of the stack as seen in FIG. 3 of "A Wide-Bandwidth Low-Voltage PLL for PowerPC™ Microprocessors," IEEE Journal of Solid-State Circuits, vol. SC-30, pp. 383–391 (April 1995). The gated devices can also be within the stack, as shown in FIG. 3. In such structures, the switching device forces the current in the current sources/sinks to be shut off, resulting in large biasing differences between conducting and non-conducting states.

In the circuit of FIG. 3 for example, node pm1 will rise to the level of the supplied analog voltage $AV_{dd}$ when the input UPB from the PFD is high (the unasserted state). When UPB is asserted (low), the initial current in device Ip2 is larger than the desired peak current (normally supplied by Ip1) since the source-to-gate voltage $V_{sg}$ is approximately equal to $AV_{dd}$, and parasitic capacitances on node pm1 contribute additional transient currents. For small phase errors, the charge-pump's response is dominated by the initial transient current (phase errors corresponding to the region between the origin and points ax or bx on FIG. 2), generating a higher slope region at the origin and a discontinuity in the response after the transient has died out (discontinuities "A" and "B"). The transient current is not well-controlled since it is due to parasitics and will be different for charge and discharge operations, creating a discontinuity in the slope at the origin of the transfer function (discontinuity "C").

In light of the foregoing, it would be desirable to devise an improved charge-pump which eliminated or substantially reduced these transient currents. It would be further advantageous if the transients could be effectively eliminated over the full range of current settings, in a charge-pump having programmable current sources and sinks.

SUMMARY OF THE INVENTION

It is therefore one object of the present invention to provide an improved clock circuit, such as may be used with a microprocessor or other high-performance computer components.

It is another object of the present invention to provide such a clock circuit having a phase-lock loop (PLL) which uses a charge-pump and filter to supply differential control inputs to a voltage-controlled oscillator.

It is yet another object of the present invention to provide a clock circuit using such a charge-pump which reduces or eliminates transient currents in switching devices to yield a more linear response for small phase errors.

The foregoing objects are achieved in a charge-pump circuit generally comprising a first error signal input, a second error signal input, a control signal output, first means for switching the control signal output to a current source in response to a first error signal received at the first error signal input, second means for switching the control signal output to a current sink in response to a second error signal received at the second error signal input, and means for substantially reducing transient currents in the first and second switching means. In an illustrative embodiment which provides differential outputs, the charge-pump circuit further comprises a third error signal input, a fourth error signal input, a second control signal output, third means for switching the second control signal output to a current source in response to a third error signal received at the third error signal input, and fourth means for switching the second control signal output to a current sink in response to a fourth error signal received at the fourth error signal input, wherein the reducing means further substantially reducing transient currents in the third and fourth switching means. The first switching means may include a first transistor having a gate connected to the first error signal input, the second switching means may include a second transistor having a gate connected to the second error signal input, the third switching means may include a third transistor having a gate connected to the third error signal input, the fourth switching means may include a fourth transistor having a gate connected to the fourth error signal input, and the reducing means includes: a fifth transistor having a source connected to a source of said first transistor, forming a first pair of source-coupled transistors, a sixth transistor having a source connected to a source of said second transistor, forming a second pair of source-coupled transistors, a seventh transistor having a source connected to a source of said third transistor, forming a third pair of source-coupled transistors, and an eighth transistor having a source connected to a source of said fourth transistor, forming a fourth pair of source-coupled transistors. In this embodiment, the first, third, fifth and seventh transistors are p-type transistors, the second, fourth, sixth and eighth transistors are n-type transistors, and the first and second error signals are asserted when the third and fourth error signals are unasserted, and the first and second error signals are unasserted when the third and fourth error signals are asserted. The current source can be formed using a first current mirror, and the current sink can be formed using a second current mirror. The four pairs of source-coupled transistors are cross-connected to keep the current sources and sinks at constant bias through near-constant conduction to substantially eliminate any turn-on transients and provides a smoother response for very small phase errors.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

DESCRIPTION OF AN ILLUSTRATIVE EMBODIMENT

Figure 1:
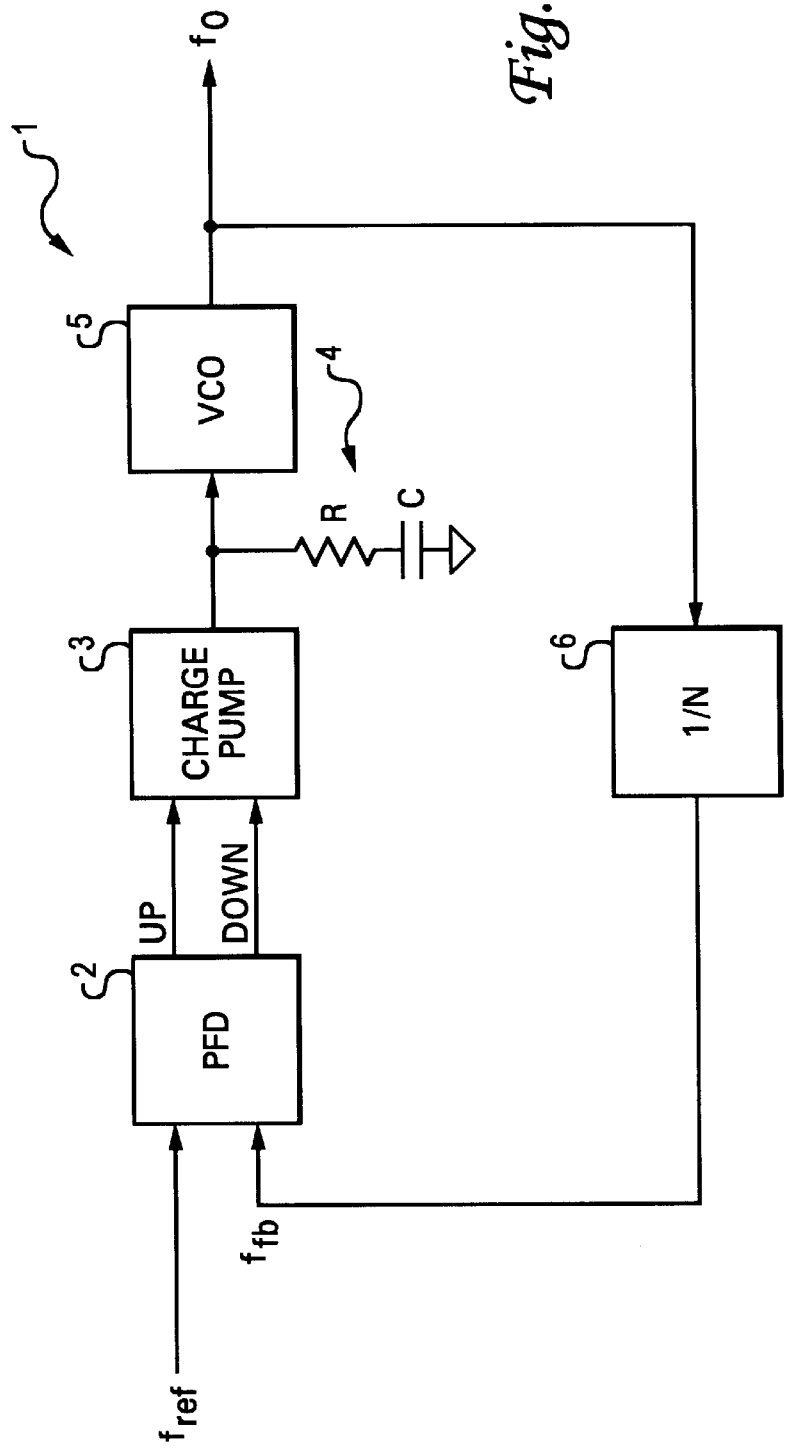
FIG. 1 is block diagram of a prior art phase-lock loop (PLL) circuit.
Figure 2:
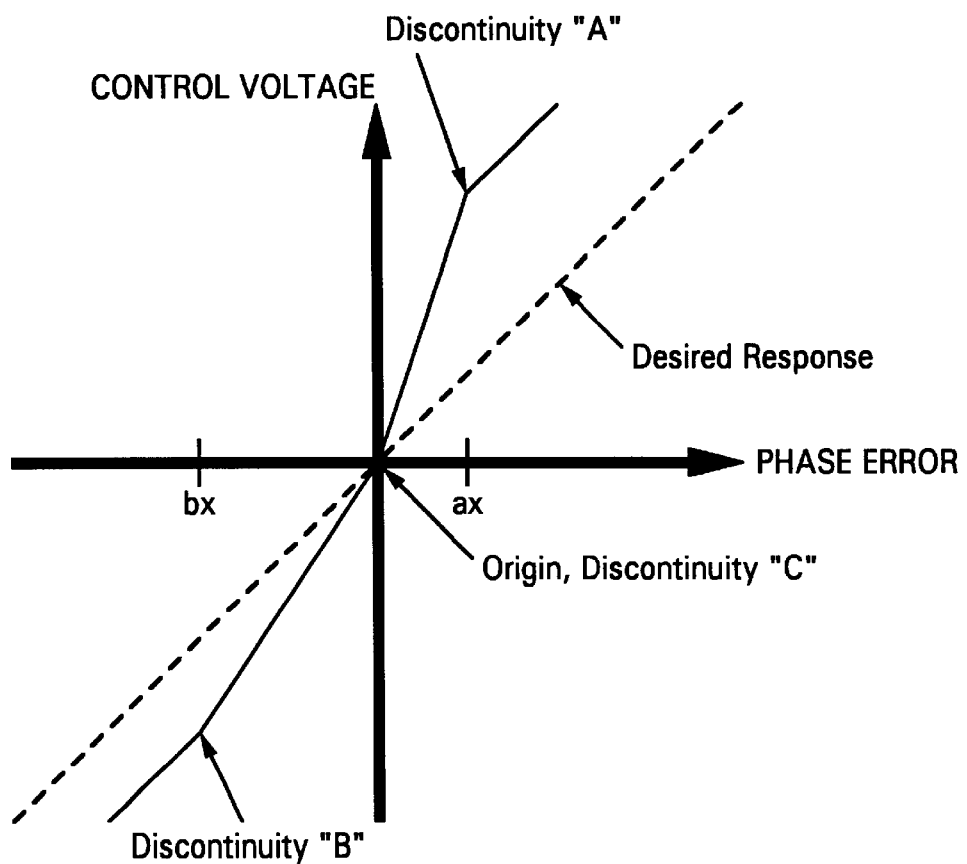
FIG. 2 is a graph of the control voltage response with respect to phase error, for an ideal PLL (in dashed lines), and a typical prior art PLL (in solid lines), illustrating discontinuities caused by transient currents in switching devices for small phase errors.
Figure 4:
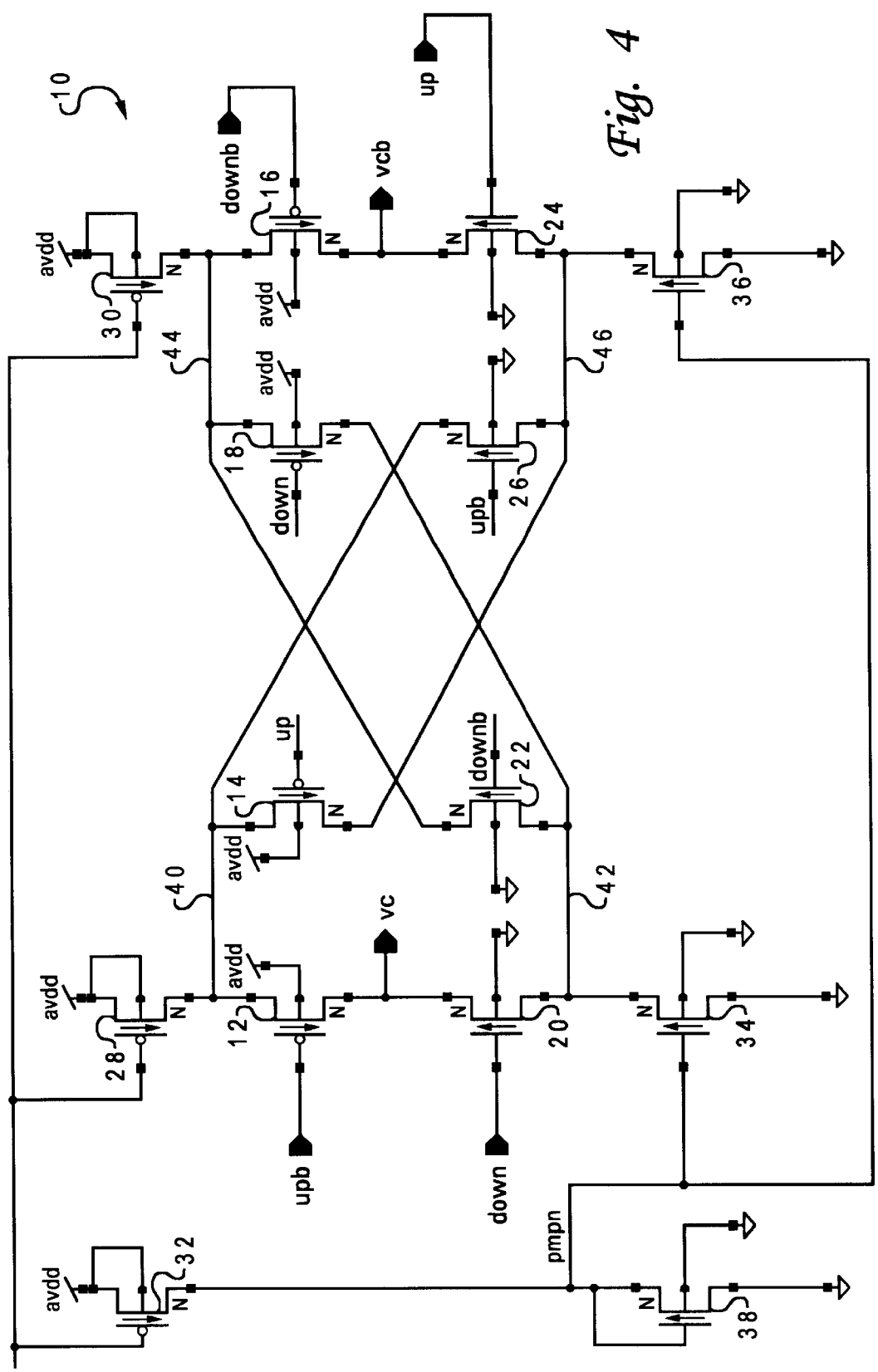
FIG. 4 is a detailed schematic diagram of one embodiment of a charge-pump constructed in accordance with the present invention, which reduces or eliminates such transient currents, and which may be used to build an improved PLL circuit.

With reference now to the figures, and in particular with reference to FIG. 4, there is depicted one embodiment 10 of a charge-pump circuit constructed in accordance with the present invention, and adapted for use in a phase-lock loop (PLL) circuit. In this embodiment, circuit 10 is used to create differential output signals $V_c$ and $V_{cb}$ which are fed to the inputs of a voltage-controlled oscillator (VCO, not shown), the VCO inputs being a source-coupled pair of p-type metal-oxide semiconducting field-effect transistors (pfets). A PLL which uses circuit 10 may include additional components such as a phase/frequency detector (not shown), connected in a manner similar to that shown in FIG. 1, wherein the outputs of the phase/frequency detector (UP, UPB, DOWN, DOWNB) are provided to charge pump 10. A suitable phase/frequency detector (PFD) is described in U.S. patent application Ser. No. 08/888,797.

As will become apparent to those skilled in the art, charge pump 10 substantially eliminates initial transient currents in the switching devices, which greatly improves performance for very small phase errors. As such, circuit 10 is particularly useful in a PLL circuit designed for a high-speed computer clock, i.e., for microprocessors or other high-performance computer components operating at speeds of one gigahertz or more. The present invention is not, however, limited to such applications.

Charge pump 10 includes a first pair of p-type metal-oxide semiconducting field-effect transistors (pfets) 12 and 14 connected to form a differential source-coupled pair. Similar differential source-coupled pairs are formed by pfets 16 and 18, and by n-type metal-oxide semiconducting field-effect transistors (nfets) 20 and 22, and nfets 24 and 26, respectively. The UP signal from a PFD is connected to the gate of pfet 14 and nfet 24. The UPB signal from the PFD is connected to the gate of pfet 12 and nfet 26. The DOWN signal from the PFD is connected to the gate of pfet 18 and nfet 20. The DOWNB signal from the PFD is connected to the gate of pfet 16 and nfet 22. Output signal $V_c$ is provided at the drains of pfet 12 and nfet 20, while output signal $V_{cb}$ is provided at the drains of pfet 16 and nfet 24.

The sources of pfets 12 and 14 are connected to the drain of another pfet 28, whose source is connected to the analog supply voltage $AV_{dd}$ which, in the depicted embodiment, is about 1.8 volts. Similar connections are provided for differential source-coupled pfet pair 16 and 18. The sources of pfets 16 and 18 are connected to the drain of another pfet 30, whose source is also connected to $AV_{dd}$. The gates of pfets 28 and 30 are connected to the gate of another pfet 32 to form two current mirrors. These three gates are controlled by a circuit similar to that shown in the left portion of FIG. 3, in which a current reference circuit is used to create mirrors which are combined using transmission gates that are selectively controlled with program inputs.

Although only one pfet is depicted at each device 28, 30 and 32, multiple devices (e.g., three) could be coupled together to feed each source-coupled pair.

The sources of nfets 20 and 22 are connected to the drain of another nfet 34, whose source is connected to the ground plane. Similar connections are provided for differential source-coupled nfet pair 24 and 26. The sources of nfets 24 and 26 are connected to the drain of another nfet 36, whose source is also connected to ground. The gates of nfets 34 and 36 are connected to the gate of another nfet 38 (whose source is connected to the drain of pfet 32) to form two more current mirrors.

The source-coupled pfet and nfet pairs are also cross-connected. The node 40 of pfets 12 and 14 is connected to the drain of nfet 26; the node 42 of nfets 20 and 22 is connected to the drain of pfet 18; the node 44 of pfets 16 and 18 is connected to the drain of nfet 22; and the node 46 of nfets 24 and 46 is connected to the drain of pfet 14. In this manner, one side of each of these differential pairs will always be conducting, forcing current to or from the filter network attached to $V_c$ and $V_{cb}$ or passing current through an alternate path.

The signals UP/UPB and DOWN/DOWNB are complementary, and UP and DOWN are never asserted simultaneously, although they may both be unasserted. If UP is asserted, then: $V_c$ will charge through pfet 28 and pfet 12; $V_{cb}$ will discharge through nfet 24 and nfet 38; and DOWN is unasserted, forcing current through the path pfet 30, pfet 18, nfet 22, and nfet 34. If DOWN is asserted, then: $V_c$ will discharge through nfet 20 and nfet 34; $V_{cb}$ will charge through pfet 30 and pfet 16; and UP is unasserted, forcing current through the path pfet 28, pfet 14, nfet 26, and nfet 36. If both UP and DOWN are unasserted, $V_c$ and $V_{cb}$ will hold their existing values, and current will flow through the path pfet 28, pfet 14, nfet 26, and nfet 36, and the path pfet 30, pfet 18, nfet 22, and nfet 34. In this embodiment, current sources/sinks pfet 28/nfet 34 and pfet 30/nfet 36 are kept at constant bias through near-constant conduction, which substantially eliminates the turn-on transient, and provides a smoother response at very small phase errors (i.e., less than about 5 psec jitter). Current each branch is effectively "recycled" for use by the complementary branch.

Figure 3:
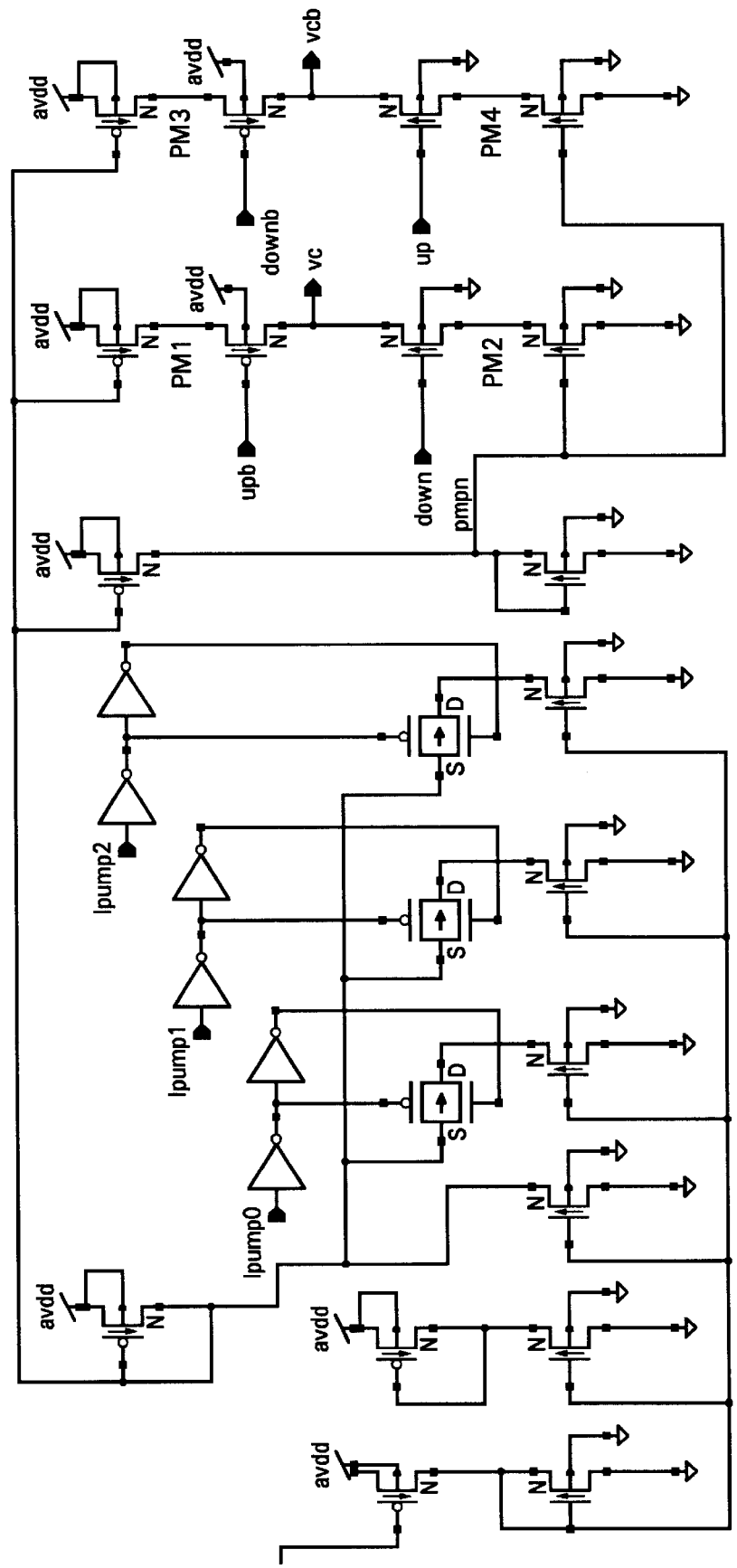
FIG. 3 is a detailed schematic diagram of a conventional charge-pump which exhibits the discontinuous response of FIG. 2.
Figure 5:
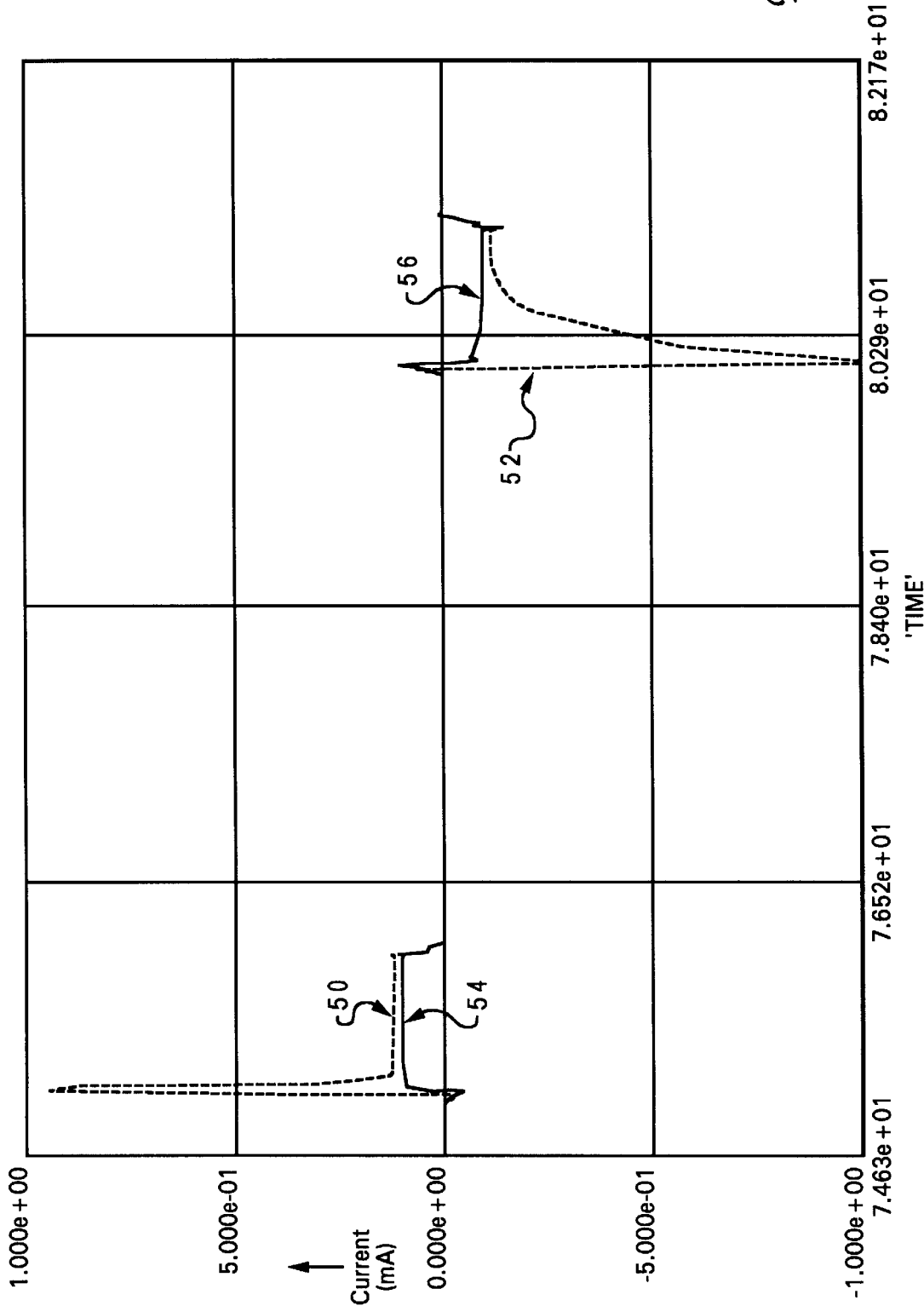
FIG. 5 is a graph showing current response for the conventional charge-pump of FIG. 3 and for the novel charge-pump of FIG. 4, for assertions of up/down with an intermediate current setting.

FIG. 5 shows the current for a conventional charge-pump such as that shown in FIG. 3 (curves 50, 52 in dashed lines), and for the embodiment of the present invention shown in FIG. 4 (curves 54, 56), for assertions of UP/DOWN for an intermediate current setting. Transients are effectively eliminated over the full range of current settings (e.g., from 15 $\mu$A to 30 $\mu$A).

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A charge-pump circuit for supplying one or more control signals based on one or more error signals, comprising:

a first error signal input;
a second error signal input;
a third error signal input;
a fourth error signal input;
a first control signal output;
a second control signal output;
first means for selectively connecting said control signal output to a current source in response to a first error signal received at said first error signal input, said first connecting means including a first transistor having a gate connected to said first error signal input;
second means for selectively connecting said control signal output to a current sink in response to a second error signal received at said second error signal input, said second connecting means including a second transistor having a gate connected to said second error signal input;
third means for selectively connecting said second control signal output to a current source in response to a third error signal received at said third error signal input; and
fourth means for selectively connecting said second control signal output to a current sink in response to a fourth error signal received at said fourth error signal input, said reducing means further substantially reducing transient currents in said third and fourth switching means; and
means for substantially reducing transient currents in said first and second connecting means, said reducing means including a third transistor having a source connected to a source of said first transistor, forming a first pair of source-coupled transistors, and a fourth transistor having a source connected to a source of said second transistor, forming a second pair of source-coupled transistors.

2. The charge-pump circuit of claim 1 wherein said current source and said current sink are programmable over a range of at least 15 $\mu$A to 30 $\mu$A, and said transient currents are effectively eliminated over said range.

3. A phase-lock loop (PLL) using the charge-pump circuit of claim 1, and further comprising:
phase/frequency detector means for supplying the first and second error signals; and
voltage-controlled oscillator means for providing a feedback signal to said phase/frequency detector means, said feedback signal being based on said control signal output.

4. The charge-pump circuit of claim 1 wherein:
said first transistor is a p-type transistor;
said second transistor is an n-type transistor; and
said first error signal is asserted when said second error signal is asserted, and said first error signal is unasserted when said second error signal is unasserted.

5. The charge-pump circuit of claim 1 wherein
said first switching means includes a first transistor having a gate connected to said first error signal input;
said second switching means includes a second transistor having a gate connected to said second error signal input;
said third switching means includes a third transistor having a gate connected to said third error signal input;
said fourth switching means includes a fourth transistor having a gate connected to said fourth error signal input; and
said reducing means includes a fifth transistor having a source connected to a source of said first transistor, forming a first pair of source-coupled transistors, a sixth transistor having a source connected to a source of said second transistor, forming a second pair of source-coupled transistors, a seventh transistor having a source connected to a source of said third transistor, forming a third pair of source-coupled transistors, and an eighth transistor having a source connected to a source of said fourth transistor, forming a fourth pair of source-coupled transistors.

6. The charge-pump circuit of claim 5 wherein:

said first, third, fifth and seventh transistors are p-type transistors;

said second, fourth, sixth and eighth transistors are n-type transistors; and said first and second error signals are asserted when said third and fourth error signals are unasserted, and said first and second error signals are unasserted when said third and fourth error signals are asserted.

7. The charge-pump circuit of claim 6 wherein:

said current source is formed using a first current mirror; and said current sink is formed using a second current mirror.

8. The charge-pump circuit of claim 6 wherein:

a gate of said fifth transistor is connected to said fourth error signal input, and a drain of said fifth transistor is connected to said sources of said fourth and eighth transistors;

a gate of said sixth transistor is connected to said third error signal input, and a drain of said sixth transistor is connected to said sources of said third and seventh transistors;

a gate of said seventh transistor is connected to said second error signal input, and a drain of said seventh transistor is connected to said sources of said second and sixth transistors; and a gate of said eighth transistor is connected to said first error signal input, and a drain of said eighth transistor is connected to said sources of said first and fifth transistors.

9. A circuit for supplying differential control signals to a voltage-controlled oscillator used by a phase-lock loop, the circuit comprising:

a first error signal input for receiving a first error signal from a phase/frequency detector;

a second error signal input for receiving a second error signal from a phase/frequency detector;

a third error signal input for receiving a third error signal from a phase/frequency detector;

a fourth error signal input for receiving a fourth error signal from a phase/frequency detector;

a first control signal output;

a second control signal output;

a first current source;

a second current source;

a first current sink;

a second current sink;

first means for switching said first control signal output to said first current source in response to a first error signal received at said first error signal input;

second means for switching said first control signal output to said first current sink in response to a second error signal received at said second error signal input; and third means for switching said second control signal output to said second current source in response to a third error signal received at said third error signal input;

fourth means for switching said second control signal output to said second current sink in response to a fourth error signal received at said fourth error signal input; and means for substantially reducing transient currents in said first, second, third and fourth switching means.

10. The circuit of claim 9 wherein said first and second current sources and said first and second current sinks are programmable over a range of at least 15 $\mu$A to 30 $\mu$A, and said transient currents are effectively eliminated over said range.

11. A phase-lock loop (PLL) using the circuit of claim 9, and further comprising:

a phase/frequency detector having first, second, third and fourth outputs supplying the first, second, third and fourth error signals, respectively, and having a first input which receives a reference clock signal; and a voltage-controlled oscillator having a feedback output which is coupled to a second input of said phase/frequency detector means, said voltage controlled oscillator having a first input connected to said first control signal output, and a second input connect to said second control signal output.

12. The circuit of claim 9 wherein said first switching means includes a first transistor having a gate connected to said first error signal input;

said second switching means includes a second transistor having a gate connected to said second error signal input; and said third switching means includes a third transistor having a gate connected to said third error signal input;

said fourth switching means includes a fourth transistor having a gate connected to said fourth error signal input; and said reducing means includes a fifth transistor having a source connected to a source of said first transistor, forming a first pair of source-coupled transistors, a sixth transistor having a source connected to a source of said second transistor, forming a second pair of source-coupled transistors, a seventh transistor having a source connected to a source of said third transistor, forming a third pair of source-coupled transistors, and an eighth transistor having a source connected to a source of said fourth transistor, forming a fourth pair of source-coupled transistors.

13. The circuit of claim 12 wherein:

said first, third, fifth and seventh transistors are p-type transistors;

said second, fourth, sixth and eighth transistors are n-type transistors; and said first and second error signals are asserted when said third and fourth error signals are unasserted, and said first and second error signals are unasserted when said third and fourth error signals are asserted.

14. The circuit of claim 13 wherein:

said first and second current sources are formed using first and second current mirrors; and said first and second current sinks are formed using third and fourth current mirrors.

15. The circuit of claim 13 wherein:

a gate of said fifth transistor is connected to said fourth error signal input, and a drain of said fifth transistor is connected to said sources of said fourth and eighth transistors;

a gate of said sixth transistor is connected to said third error signal input, and a drain of said sixth transistor is connected to said sources of said third and seventh transistors;

a gate of said seventh transistor is connected to said second error signal input, and a drain of said seventh transistor is connected to said sources of said second and sixth transistors; and a gate of said eighth transistor is connected to said first error signal input, and a drain of said eighth transistor is connected to said sources of said first and fifth transistors.

* * * * *